US012563757B2

(12) United States Patent
Fujita et al.

(10) Patent No.: US 12,563,757 B2
(45) Date of Patent: Feb. 24, 2026

(54) SCHOTTKY BARRIER DIODE

(71) Applicant: TDK Corporation, Tokyo (JP)

(72) Inventors: Minoru Fujita, Tokyo (JP); Jun Arima, Tokyo (JP); Katsumi Kawasaki, Tokyo (JP); Jun Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 566 days.

(21) Appl. No.: 17/784,864

(22) PCT Filed: Oct. 5, 2020

(86) PCT No.: PCT/JP2020/037722
§ 371 (c)(1),
(2) Date: Jun. 13, 2022

(87) PCT Pub. No.: WO2021/124649
PCT Pub. Date: Jun. 24, 2021

(65) Prior Publication Data
US 2023/0352601 A1    Nov. 2, 2023

(30) Foreign Application Priority Data
Dec. 18, 2019    (JP) ................................. 2019-228555

(51) Int. Cl.
*H10D 8/60*        (2025.01)
*H10D 62/10*      (2025.01)
(Continued)

(52) U.S. Cl.
CPC ........... *H10D 8/605* (2025.01); *H10D 62/107* (2025.01); *H10D 62/80* (2025.01); *H10D 64/117* (2025.01); *H10D 99/00* (2025.01)

(58) Field of Classification Search
CPC ............................... H10D 8/605; H10D 62/80
See application file for complete search history.

(56) References Cited

U.S. PATENT DOCUMENTS

2010/0289110 A1*  11/2010  Tarui ..................... H01L 29/408
                                                                257/490
2013/0168765 A1*  7/2013  Lin ...................... H01L 29/7813
                                                                257/334
(Continued)

FOREIGN PATENT DOCUMENTS

JP        2015-507849 A        3/2015
JP        2015-153769 A        8/2015
(Continued)

OTHER PUBLICATIONS

Extended European Search Report issued for the corresponding European patent Application No. 20902798.6 on Nov. 29, 2023.
(Continued)

*Primary Examiner* — Vincent Wall
(74) *Attorney, Agent, or Firm* — Rimon P.C.

(57)        ABSTRACT

A Schottky barrier diode includes an anode electrode which is brought into Schottky contact with a drift layer, a cathode electrode which is brought into ohmic contact with a semi-conductor substrate, an insulating film covering the inner wall of a trench formed in the drift layer, a metal film covering the inner wall of the trench through the insulating film and electrically connected to the anode electrode, and a field insulating layer. The field insulating layer includes a first part positioned between an upper surface of the drift layer and the anode electrode and a second part covering the inner wall of the trench through the metal film and insulating film. With this configuration, even when misalignment occurs between the trench and the field insulating layer, dielectric breakdown can be prevented.

2 Claims, 11 Drawing Sheets

(51) Int. Cl.

| | |
|---|---|
| *H10D 62/80* | (2025.01) |
| *H10D 64/00* | (2025.01) |
| *H10D 99/00* | (2025.01) |

(56) References Cited

U.S. PATENT DOCUMENTS

| | | | |
|---|---|---|---|
| 2014/0284620 A1* | 9/2014 | Ota | H01L 29/45 |
| | | | 257/77 |
| 2015/0228809 A1 | 8/2015 | Sugiura | |
| 2018/0013015 A1 | 1/2018 | Sugiura | |
| 2018/0019301 A1* | 1/2018 | Yasuda | H01L 29/872 |
| 2018/0269335 A1* | 9/2018 | Hasegawa | H01L 29/47 |
| 2019/0148563 A1 | 5/2019 | Sasaki et al. | |
| 2019/0363197 A1* | 11/2019 | Sasaki | H01L 21/02057 |
| 2021/0020789 A1 | 1/2021 | Sasaki et al. | |
| 2021/0167225 A1 | 6/2021 | Arima et al. | |
| 2021/0343879 A1* | 11/2021 | Arima | H01L 29/24 |
| 2021/0384362 A1* | 12/2021 | Li | H01L 29/407 |

FOREIGN PATENT DOCUMENTS

| | | | |
|---|---|---|---|
| JP | 2017-199869 A | 11/2017 | |
| JP | 2019-079984 A | 5/2019 | |
| TW | 201419553 A | 5/2014 | |
| TW | 201937728 A | 9/2019 | |
| WO | 2019/082580 A1 | 5/2019 | |

OTHER PUBLICATIONS

International Search Report issued in corresponding International Patent Application No. PCT/JP2020/037722, dated Dec. 1, 2020, with English translation.

* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2020/037722, filed on Oct. 5, 2020, which claims the benefit of Japanese Patent Application No. 2019-228555, filed on Dec. 18, 2019, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (about 8 MV/cm), so that a Schottky barrier diode using gallium oxide is very promising as the switching element for a power device. An example of the Schottky barrier diode using gallium oxide is described in Patent Documents 1 and 2.

Schottky barrier diodes described in Patent Documents 1 and 2 have a field plate structure having a plurality of trenches provided in a gallium oxide layer and a field insulating layer provided between the gallium oxide layer and the outer peripheral portion of an anode electrode. With the above structure, where the plurality of trenches are formed in the gallium oxide layer, when a reverse voltage is applied, a mesa region positioned between adjacent trenches becomes a depletion layer, so that a channel region of a drift layer is pinched off. Thus, a leak current upon application of the reverse voltage can be significantly reduced. Further, with the field plate structure, electric field concentration at an end portion of the anode electrode is relaxed.

CITATION LIST

Patent Document

[Patent Document 1] JP 2017-199869A
[Patent Document 2] JP 2019-079984A

SUMMARY OF THE INVENTION

Problem to be Solved by the Invention

However, formation of the trench and patterning of the insulating layer are carried out in separate processes, so that the formation positions of the trench and insulating layer may be misaligned. This makes it difficult to make the end portion of the field insulating layer and the end portion of the trench accurately coincide with each other in position. When the end portion of the field insulating layer shifts to the outside of the end portion of the trench, the anode electrode and a semiconductor layer directly contact each other in the outside area of the trench, which may cause dielectric breakdown at this portion. On the other hand, when the end portion of the field insulating layer shifts to the inside of the end portion of the trench, a part of the field insulating layer is formed inside the trench. In this case, an electric field concentrates on a corner portion of the field insulating layer formed inside the trench, the corner portion being the boundary between a part of the field insulating layer covering the trench side wall and a part thereof covering the trench bottom portion, which may cause dielectric breakdown.

It is therefore an object of the present invention to prevent, in a Schottky barrier diode using gallium oxide, dielectric breakdown caused due to misalignment between the trench and the field insulating layer.

Means for Solving the Problem

A Schottky barrier diode according to the present invention includes: a semiconductor substrate made of gallium oxide; a drift layer made of gallium oxide and formed on the semiconductor substrate; an anode electrode brought into Schottky contact with the drift layer; a cathode electrode brought into ohmic contact with the semiconductor substrate; an insulating film covering the inner wall of a trench formed in the drift layer; a metal film covering the inner wall of the trench through the insulating film and electrically connected to the anode electrode; and a field insulating layer. The field insulating layer includes a first part positioned between the upper surface of the drift layer and the anode electrode and a second part covering the inner wall of the trench through the metal film and insulating film.

According to the present invention, the field insulating layer enters the inside of the trench, so that the anode electrode and the drift layer do not directly contact each other in the outside area of the trench. In addition, the metal film exists between the second part of the field insulating layer and the insulating layer, and the metal film has the same potential as the anode electrode, so that an electric field applied to the second part of the field insulating layer is significantly relaxed. This makes it possible to prevent dielectric breakdown caused due to misalignment between the trench and the field insulating layer.

In the present invention, the trench may include an outer peripheral trench formed in a ring shape and a center trench formed in an area surrounded by the outer peripheral trench. The first part of the field insulating layer may be formed in a ring shape so as to surround the outer peripheral trench, and the second part of the field insulating layer may be formed inside the outer peripheral trench. With this structure, when a reverse voltage is applied, a mesa region defined by the center trench becomes a depletion layer, so that a channel region of the drift layer is pinched off. Thus, a leak current upon application of the reverse voltage can be significantly reduced.

In the present invention, the first and second parts may be formed of different insulating materials. This can optimize the materials of the first and second parts of the field insulating layer.

Advantageous Effects of the Invention

As described above, according to the present invention, it is possible to prevent dielectric breakdown caused due to misalignment between the trench and the field insulating layer.

MODE FOR CARRYING OUT THE INVENTION

Preferred embodiments of the present invention will be explained below in detail with reference to the accompanying drawings.

Figure 1:
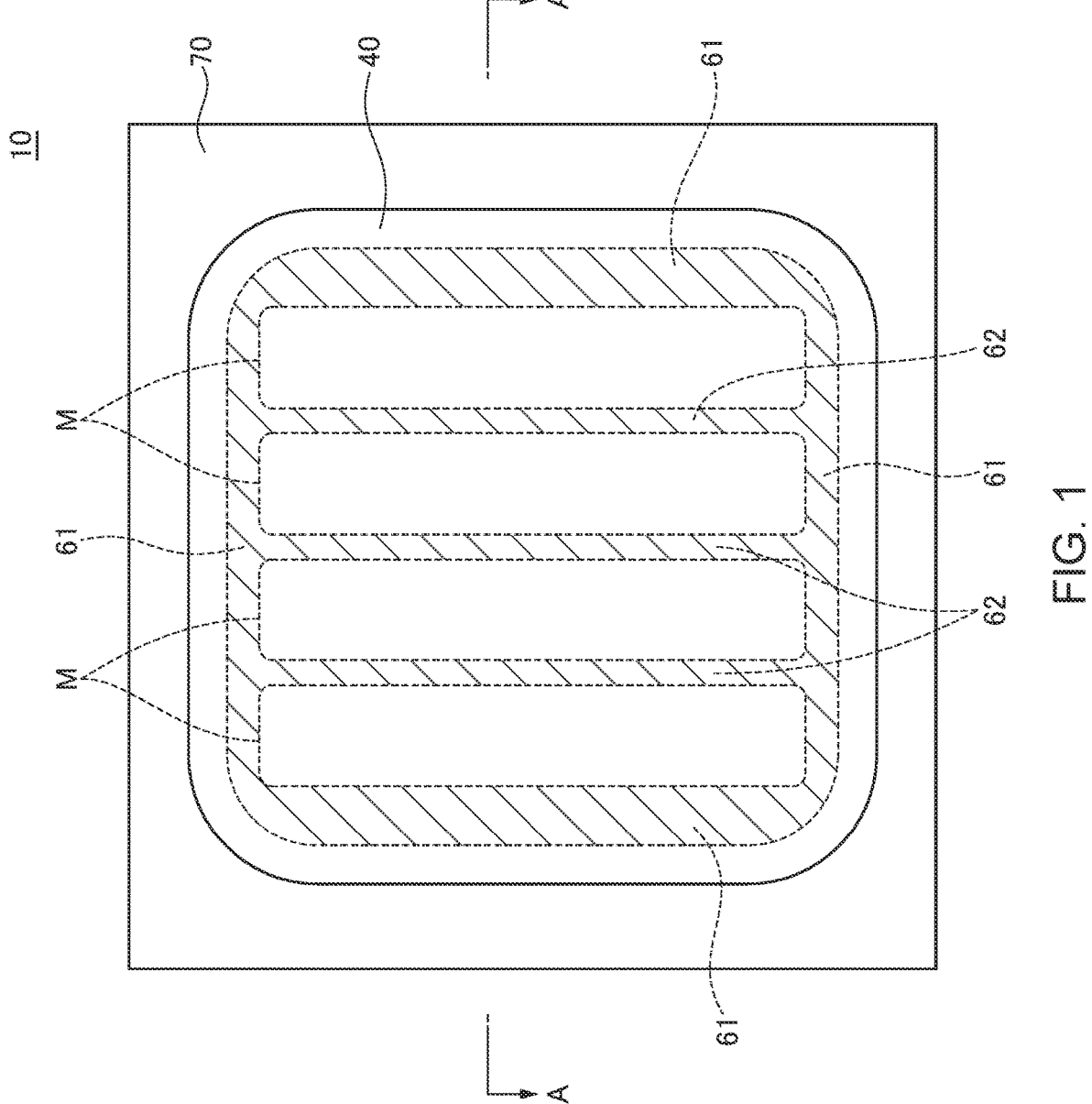
FIG. 1 is a schematic plan view illustrating the configuration of a Schottky barrier diode 10 according to an embodiment of the present invention.
Figure 2:
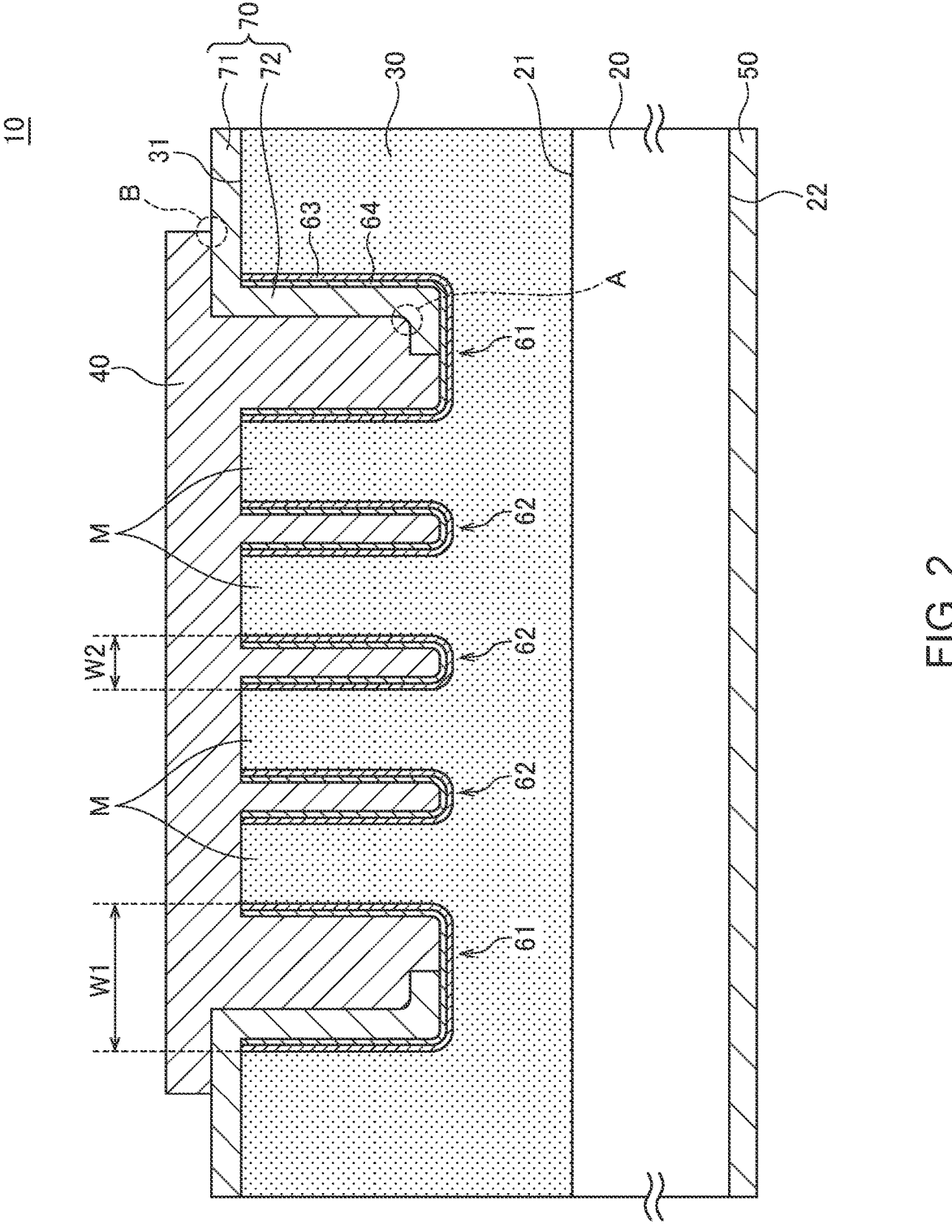
FIG. 2 is a schematic cross-sectional view taken along line A-A in FIG. 1.

FIG. 1 is a schematic plan view illustrating the configuration of a Schottky barrier diode 10 according to an embodiment of the present invention. FIG. 2 is a schematic cross-sectional view taken along line A-A in FIG. 1.

As illustrated in FIGS. 1 and 2, the Schottky barrier diode 10 according to the present embodiment has a semiconductor substrate 20 and a drift layer 30, both of which are made of gallium oxide ($\beta$-$Ga_2O_3$). The semiconductor substrate 20 and the drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness thereof is about 250 $\mu$m. Although there is no particular restriction on the planar size of the semiconductor substrate 20, the planar size is generally selected in accordance with the amount of current flowing in the element and, when the maximum amount of forward current is about 20A, the size may be set to about 2.4 mm×2.4 mm in a plan view.

The semiconductor substrate 20 in a mounted state has an upper surface 21 positioned on its upper surface side and a back surface 22 positioned on its lower surface side (opposite to the upper surface side 21). The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 $\mu$m.

An anode electrode 40, which is brought into Schottky contact with the drift layer 30, is formed on an upper surface 31 of the drift layer 30. The anode electrode 40 is formed of metal such as platinum (Pt), palladium (Pd), gold (Au), nickel (Ni), molybdenum (Mo), Cupper (Cu), or the like. The anode electrode 40 may have a multilayer structure of different metal films, such as Pt/Au, Pt/Al, Pd/Au, Pd/Al, Pt/Ti/Au, or Pd/Ti/Au. On the other hand, a cathode electrode 50, which is brought into ohmic contact with the semiconductor substrate 20, is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

In the present embodiment, trenches 61 and 62 are formed in the drift layer 30. The trenches 61 and 62 are positioned so as to overlap the anode electrode 40 in a plan view. The trench 61 is an outer peripheral trench formed in a ring shape, and the trench 62 is a center trench formed in an area surrounded by the outer peripheral trench 61. The outer peripheral trench 61 and the center trench 62 need not be completely separated from each other and may be connected to each other as illustrated in FIG. 1.

Although not particularly limited, assuming that the widths of the outer peripheral trench 61 and the center trench 62 are W1 and W2, respectively, W1>W2 is satisfied in the present embodiment. This is to prevent dielectric breakdown at the bottom portion of the outer peripheral trench 61 on which an electric field concentrates particularly. That is, an increase in the width W1 of the outer peripheral trench 61 increases the curvature radius of the bottom portion thereof or separates the edge portion constituted by the bottom portion thereof into two when the outer peripheral trench 61 is viewed in the cross section. This makes it less likely to cause dielectric breakdown in the vicinity of the bottom portion of the outer peripheral trench 61. The depth of the outer peripheral trench 61 and that of the center trench 62 are the same.

The inner wall of each of the trenches 61 and 62 is covered with an insulating film 63 made of $HfO_2$ or the like, and the surface of the insulating film 63 is covered with a metal film 64. That is, the inner wall of each of the trenches 61 and 62 is covered with a laminated film of the insulating film 63 and metal film 64. Aside from $HfO_2$, an insulating material such as $Al_2O_3$ can be used as the material of the insulating film 63. The material of the metal film 64 is not particularly limited, and the material same as that of the anode electrode 40, Cr having a high adhesion, or metal materials having high wet-etching resistance that are used in the semiconductor manufacturing process, such as Pt, Au or W, may be used.

The trenches 61 and 62 are filled with the material same as that of the anode electrode 40. In the present embodiment, a plurality of the trenches 61 and 62 are formed in the drift layer 30, so that the material of the anode electrode 40 may be one having a low work function, such as molybdenum (Mo) or copper (Cu). Further, since a plurality of the trenches 61 and 62 are formed in the drift layer 30, the dopant concentration of the drift layer 30 is increased up to about $5\times10^{16}$ cm$^{-3}$.

A part of the drift layer 30 that is defined by the trenches 61 and 62 constitutes a mesa region M. The mesa region M becomes a depletion layer when a reverse voltage is applied between the anode electrode 40 and cathode electrode 50, so that a channel region of the drift layer 30 is pinched off. Thus, a leak current upon application of the reverse voltage can be significantly reduced.

Further, a field insulating layer 70 is formed at a part of an upper surface 31 of the drift layer 30 that is positioned outside the outer peripheral trench 61 in a plan view. Examples of the material of the field insulating layer 70 may include: various kinds of resin material including epoxy resin, acrylic resin such as polymethyl metacrylate, polyurethane, polyimide, polyvinyl alcohol, fluororesin and polyolefin; and inorganic oxides or inorganic nitrides such as silicon oxide, aluminum oxide, and silicon nitride. When a resin material is used as the material of the field insulating layer 70, there are available methods of: applying and drying a resin solution to obtain a resin film; applying or vapor-depositing a resin monomer, followed by polymerization; and applying crosslinking treatment after film formation. When an inorganic material is used as the material of the field insulating layer 70, a vacuum process such as sputtering or vapor-deposition, or a solution process such as a sol-gel method may be used.

As illustrated in FIG. 2, a part of the field insulating layer 70 enters the inside of the outer peripheral trench 61, whereby a part of the inner wall of the outer peripheral trench 61 that is positioned at the outer periphery and a part of the bottom portion of the outer peripheral trench 61 are covered with the field insulating layer 70 through the metal film 64 and insulating film 63. As the material of the field insulating layer 70, an insulating material such as silicon oxide may be used. A part of the field insulating layer 70 that is formed in a ring shape on the upper surface 31 of the drift layer 30 so as to surround the outer peripheral trench 61 constitutes a first part 71, and a part thereof that is formed inside the outer peripheral trench 61 constitutes a second part 72. The first and second parts 71 and 72 may be made of the same material or different materials. For example, Al$_2$O$_3$ and SiO$_2$ may be used as the materials of the first and second parts 71 and 72, respectively.

With the above configuration, the outer peripheral portion of the anode electrode 40 is formed on the first part 71 of the field insulating layer 70. A part of the anode electrode 40 that overlaps the mesa region M is brought into Schottky contact with the drift layer 30. As a result, a so-called field plate structure is obtained, whereby an electric field applied to the bottom portion of the outer peripheral trench 61 is further relaxed. Further, the second part 72 of the field insulating layer 70 is formed not directly on the surface of the insulating film 63 but through the metal film 64 having the same potential as the anode electrode 40, so that a strong electric field is not applied to the second part 72 of the field insulating layer 70.

The following describes a manufacturing method for the Schottky barrier diode 10 according to the present embodiment.

FIGS. 3 to 9 are process views for explaining the manufacturing method for the Schottky barrier diode 10 according to the present embodiment, each of which corresponds to the cross section illustrated in FIG. 2.

Figure 3:
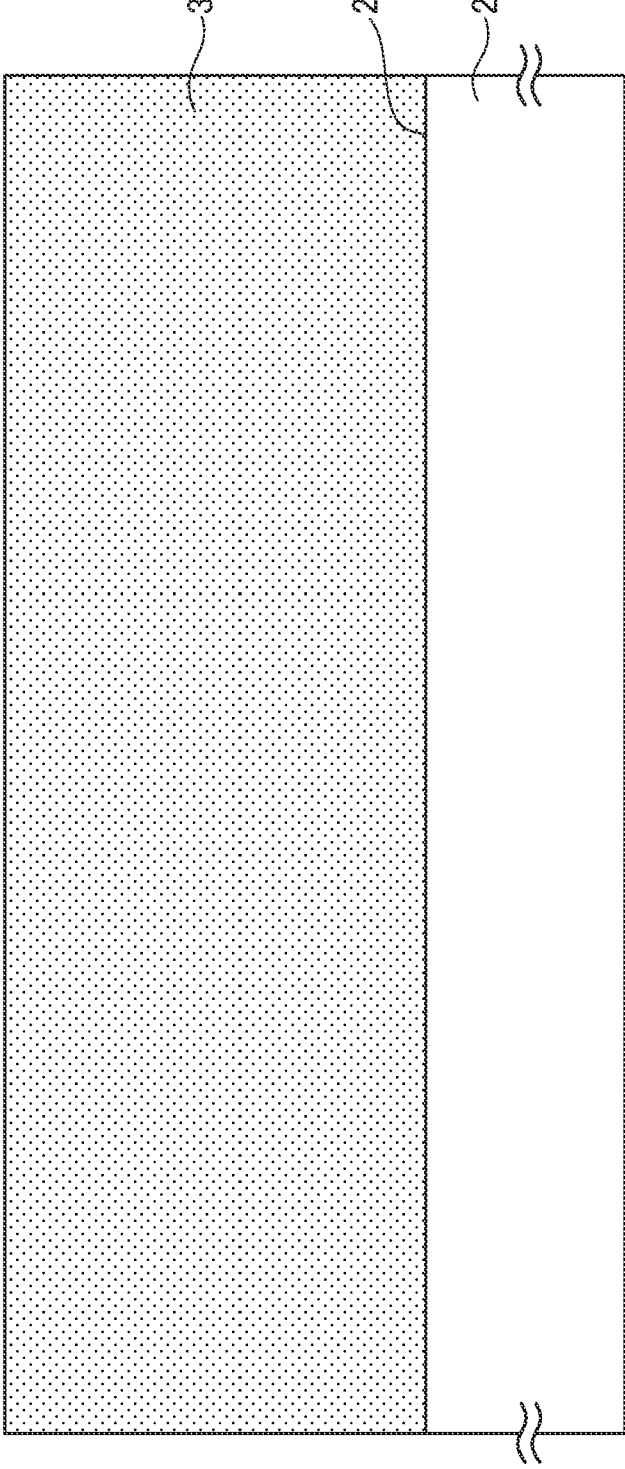
FIG. 3 is a process view for explaining the manufacturing method for the Schottky barrier diode 10.

First, as illustrated in FIG. 3, the semiconductor substrate 20 made of gallium oxide is prepared, and then the drift layer

30 made of gallium oxide is formed on the upper surface 21 of the semiconductor substrate 20. As described above, the drift layer 30 can be formed by epitaxially growing gallium oxide on the upper surface 21 of the semiconductor substrate 20 using a reactive sputtering method, a PLD method, an MBE method, an MOCVD method, or an HVPE method.

Figure 4:
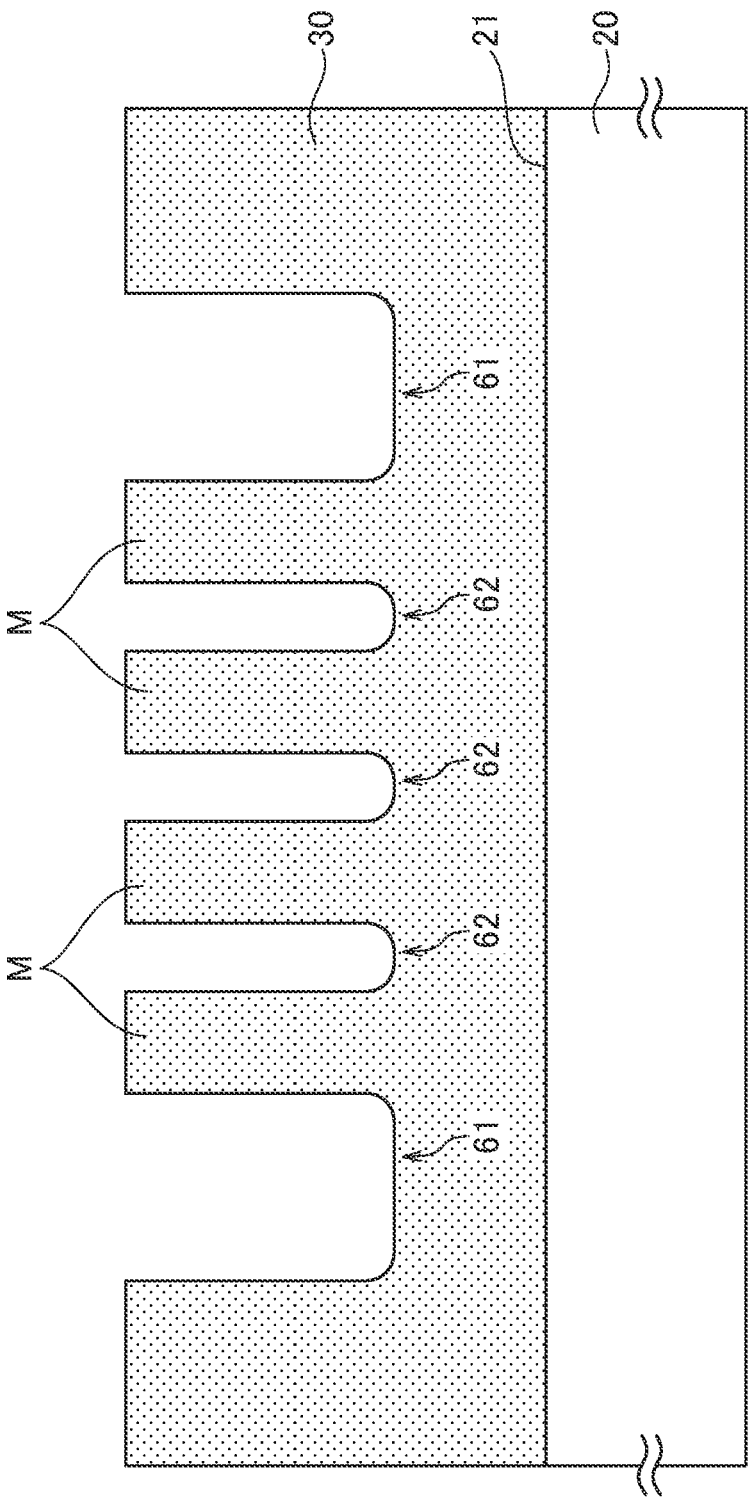
FIG. 4 is a process view for explaining the manufacturing method for the Schottky barrier diode 10.
Figure 5:
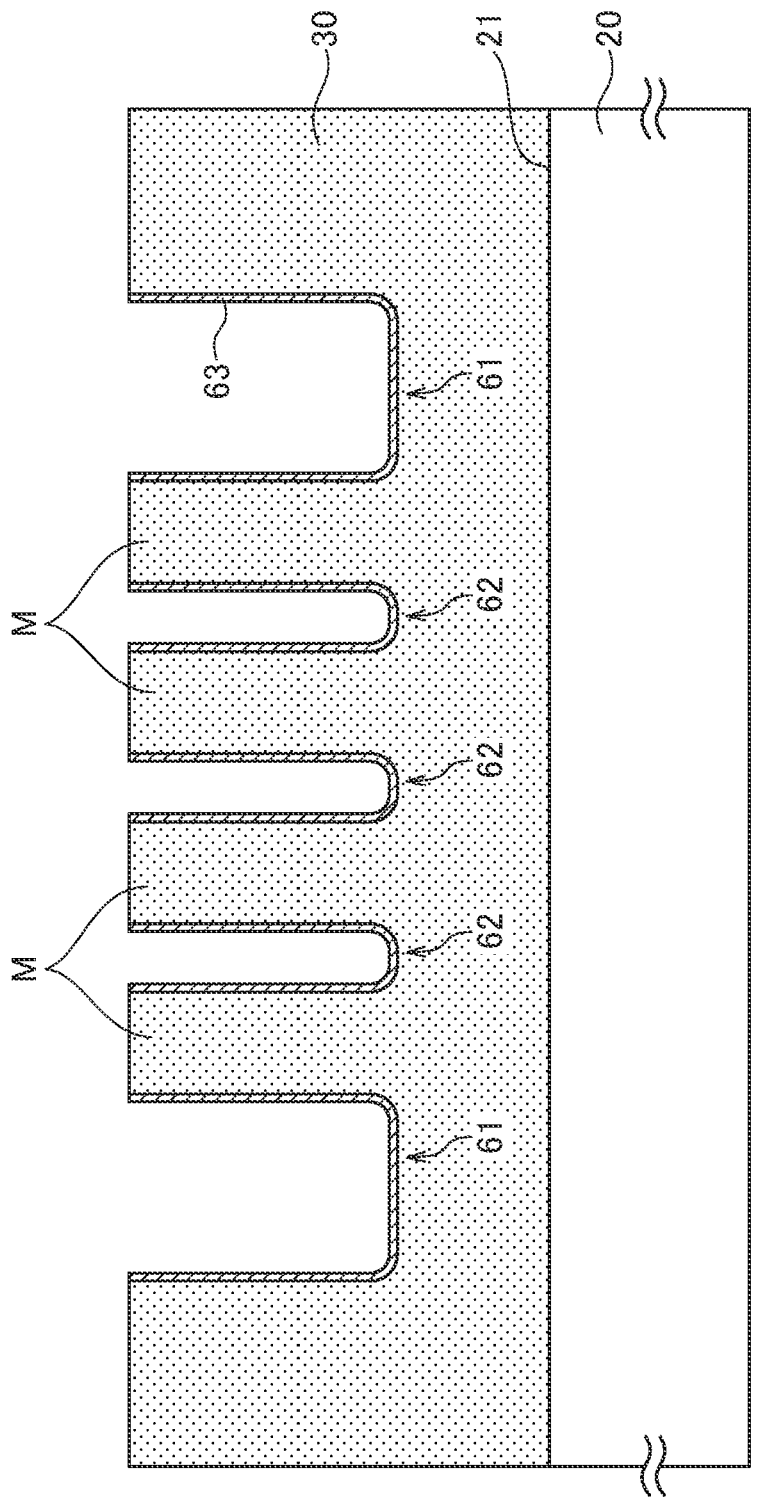
FIG. 5 is a process view for explaining the manufacturing method for the Schottky barrier diode 10.

Then, as illustrated in FIG. 4, dry-etching using BCl$_3$ or the like is performed to form the outer peripheral trench 61 and center trench 62 in the drift layer 30. Subsequently, as illustrated in FIG. 5, the insulating film 63 is formed on the surface of the drift layer 30. The insulating film 63 can be formed using a commonly known film forming method such as an ALD method. Thereafter, the insulating film 63 on the mesa region M is removed by commonly known treatment such as wet-etching, dry-etching, or CMP. As a result, the drift layer 30 on the mesa region M is exposed, and the inner wall of each of the trenches 61 and 62 is covered with the insulating film 63. At this time, the drift layer 30 on the mesa region M may be removed partly.

Figure 6:
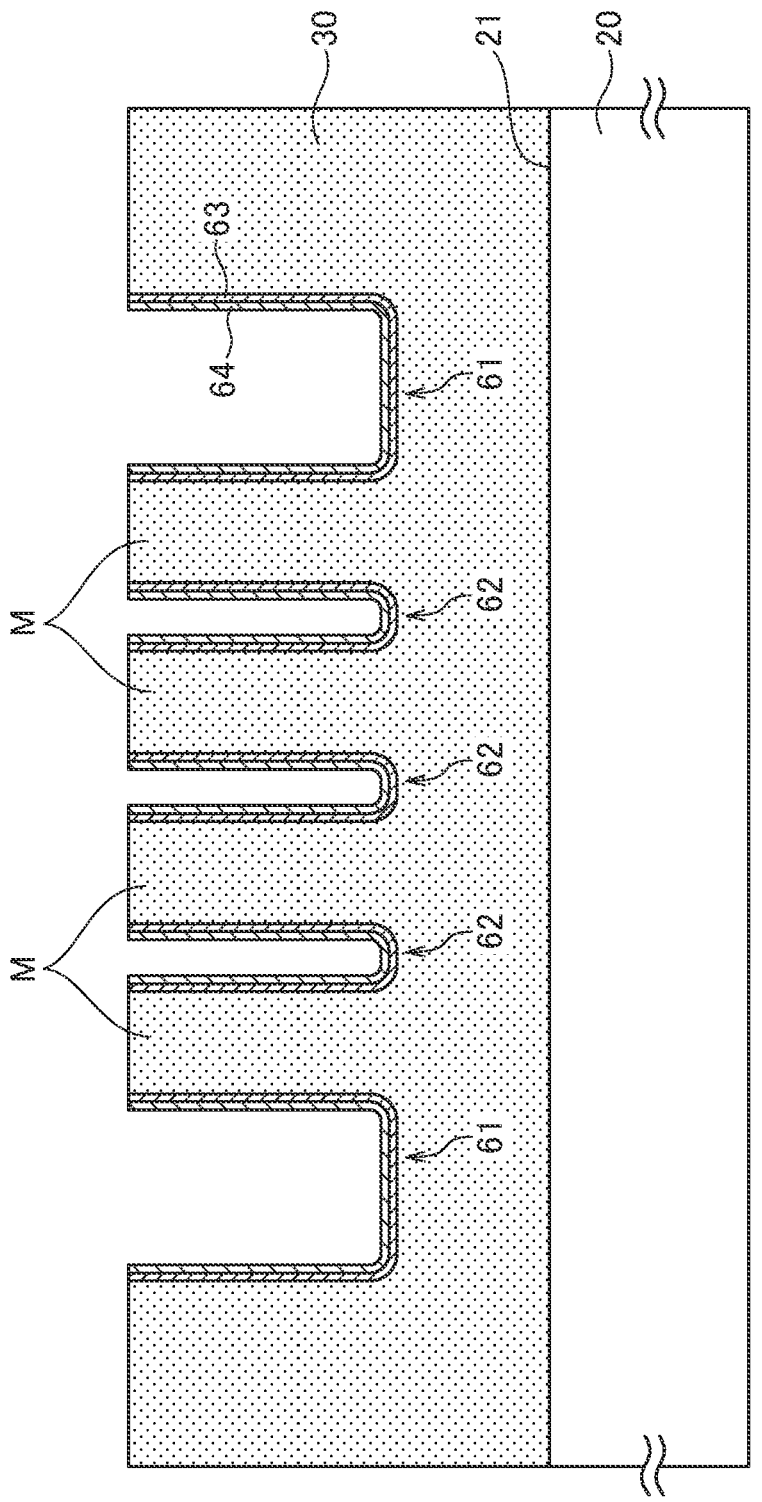
FIG. 6 is a process view for explaining the manufacturing method for the Schottky barrier diode 10.

Then, as illustrated in FIG. 6, the metal film 64 is formed on the entire surface. The metal film 64 can be formed by a commonly known film forming method such as sputtering or vapor-deposition. Thereafter, the metal film 64 on the mesa region M is removed by commonly known treatment such as wet-etching, dry-etching, or CMP. As a result, the drift layer 30 on the mesa region M is exposed, and the inner wall of each of the trenches 61 and 62 is covered with the metal film 64 through the insulating film 63. At this time, the drift layer 30 on the mesa region M may be removed partly. The removal of the insulating film 63 on the mesa region M and the removal of the metal film 64 on the mesa region M may be performed at the same time.

Figure 7:
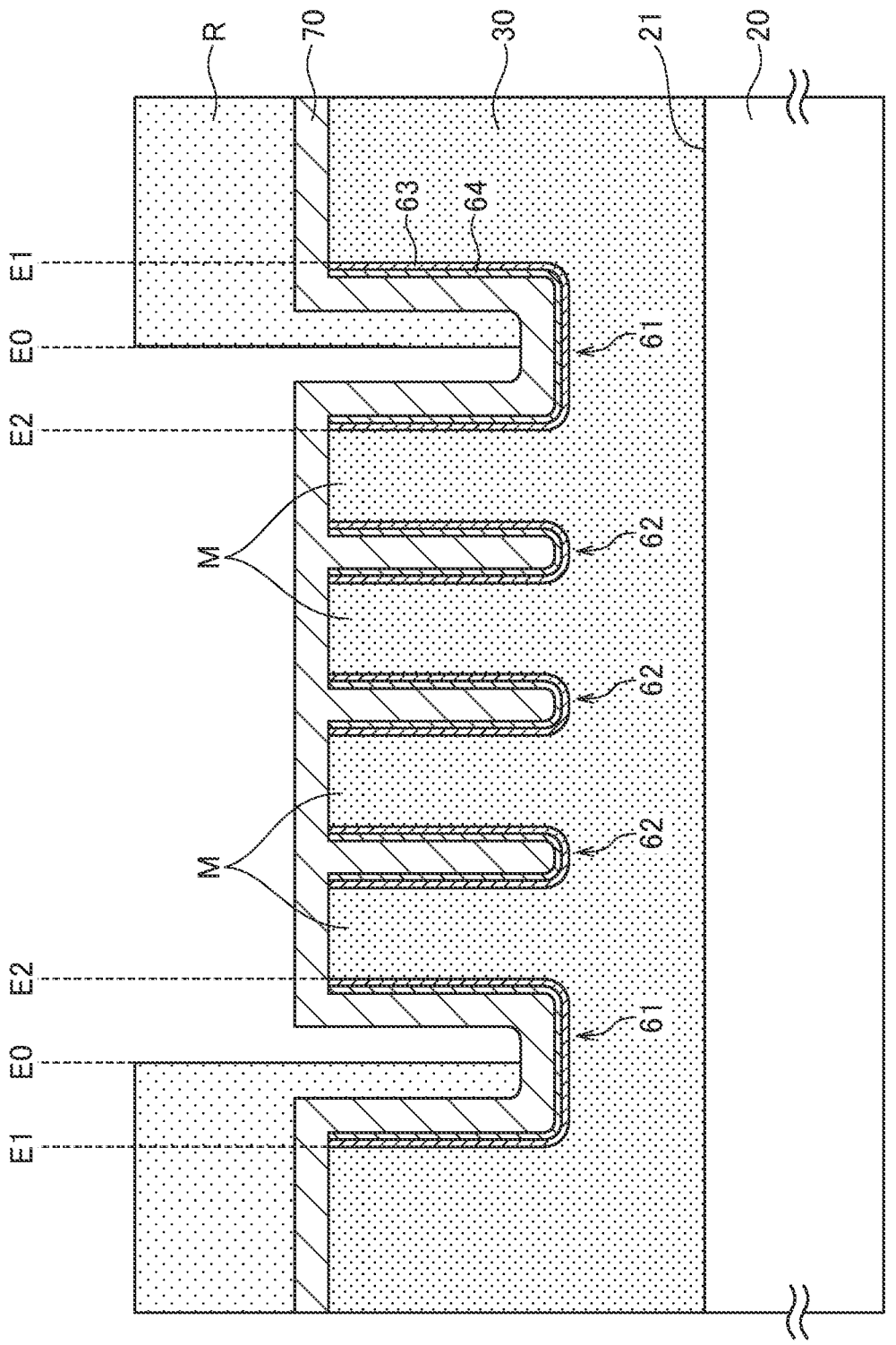
FIG. 7 is a process view for explaining the manufacturing method for the Schottky barrier diode 10.

Then, as illustrated in FIG. 7, the field insulating layer 70 is formed on the entire surface, and then a resist R that covers the outer peripheral portion of the field insulating layer 70 is formed. The field insulating layer 70 can be formed by a commonly known film forming method such as a CVD method. The resist R can be patterned by a photolithography method. An inner edge EQ of the resist R is designed so as to be positioned between an outer edge E1 of the outer peripheral trench 61 and an inner edge E2 of the outer peripheral trench 61. That is, the opening diameter of the resist R is made smaller than the outer diameter of the outer peripheral trench 61 and larger than the inner diameter of the outer peripheral trench 61 such that the inner edge EQ of the resist R is positioned inside the outer peripheral trench 61. With this configuration, even if some misalignment should occur, a part of the upper surface 31 of the drift layer 30 that is positioned outside the outer peripheral trench 61 is reliably covered with the resist R.

Figure 8:
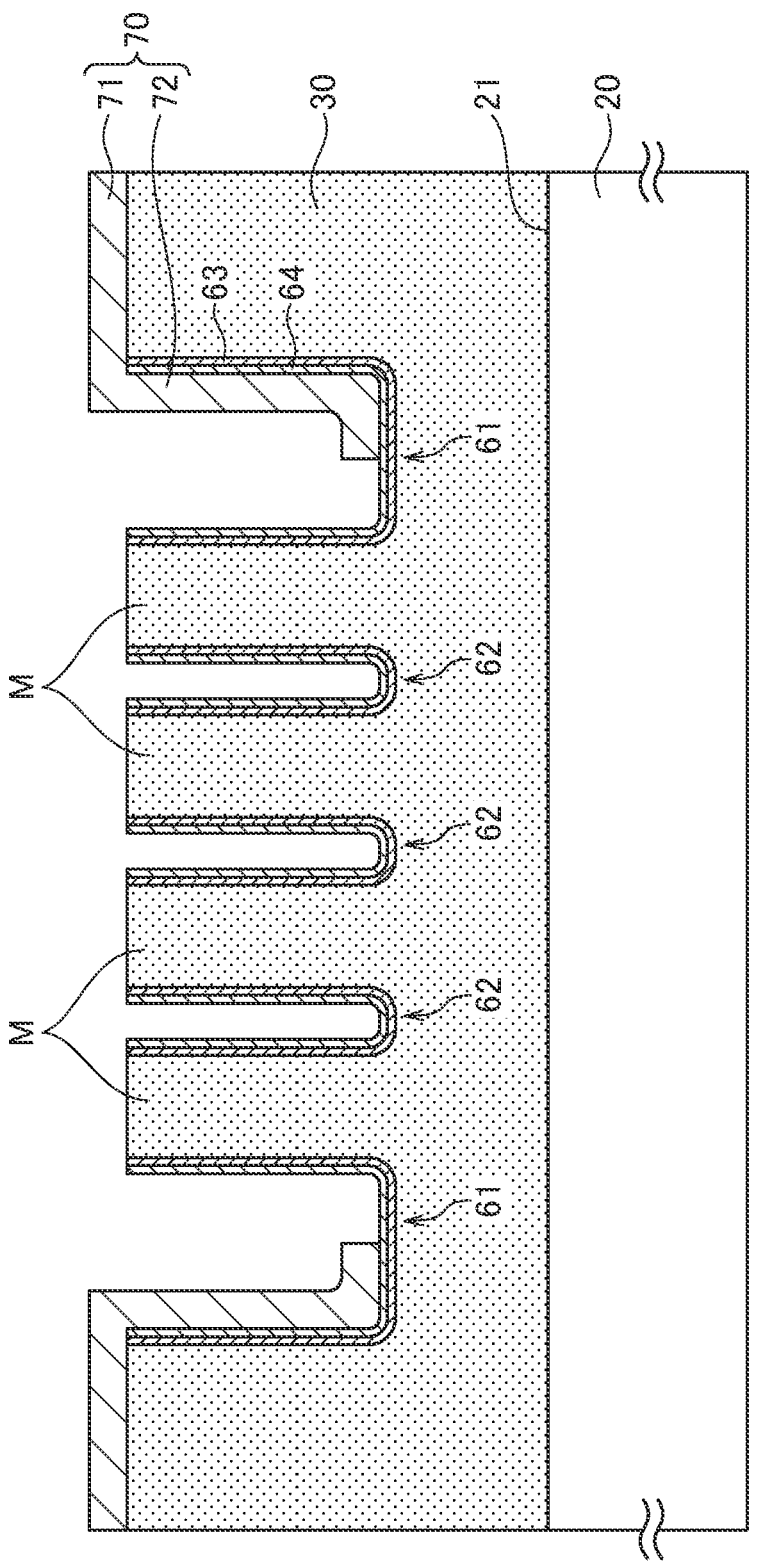
FIG. 8 is a process view for explaining the manufacturing method for the Schottky barrier diode 10.

Then, etching is performed in this state to remove a part of the field insulating layer 70 that is not covered with the resist R, as illustrated in FIG. 8. As a result, the portion of the field insulating layer 70 that is formed on the mesa region M, the portion of the field insulating layer 70 that is formed in the center trench 62, and a part of the field insulating layer 70 that is formed in the outer peripheral trench 61 are removed, while the first part 71 positioned at a part of the upper surface 31 of the drift layer 30 outside the outer peripheral trench 61 and the second part 72 that covers the outer peripheral wall and bottom portion of the outer peripheral trench 61 remain. Thus, in the present embodiment, the resist R has an opening with a diameter smaller than the outer diameter of the outer peripheral trench 61, so that a part of the upper surface 31 of the drift layer 30 outside the outer peripheral trench 61 is reliably covered with the first part 71 of the field insulating layer 70.

Figure 9:
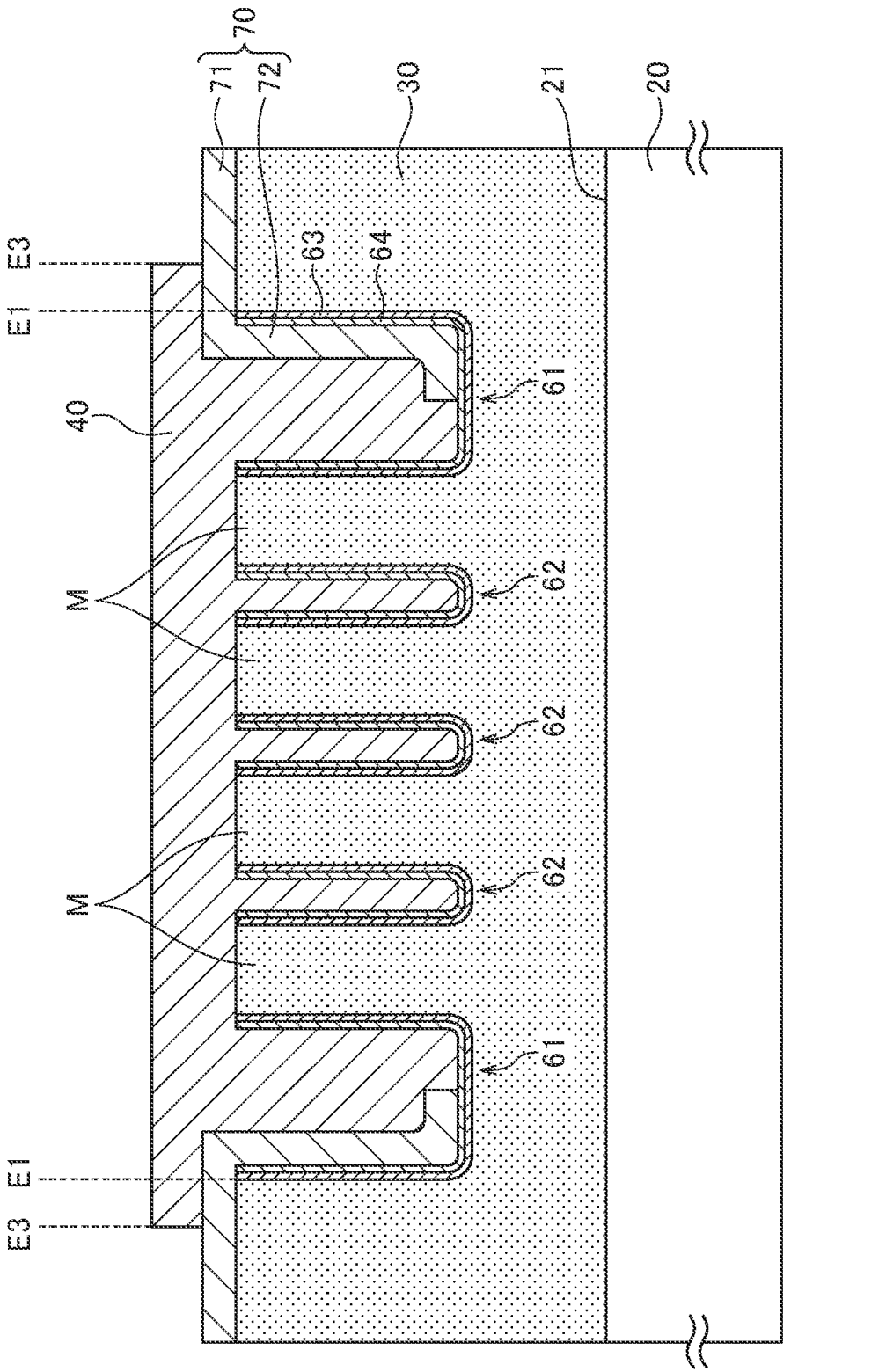
FIG. 9 is a process view for explaining the manufacturing method for the Schottky barrier diode 10.

Then, as illustrated in FIG. 9, the anode electrode 40 is formed on the entire surface, and then the outer peripheral position of the anode electrode 40 is removed. At this time, an outer peripheral edge E3 of the anode electrode 40 is designed so as to be positioned outside the outer edge E1 of the outer peripheral trench 61 to thereby form the field plate structure. The distance between the edge E1 and the edge E3, i.e., a field plate length is preferably 10 μm or more.

The metal material to be filled in the trenches 61 and 62 may be different from the material of the anode electrode 40. In this case, the anode electrode 40 may be formed before a metal material different from that of the anode electrode 40 is filled in the trenches 61 and 62, or a material different from that of the anode electrode 40 may be first filled in the trenches 61 and 62 as long as the different material does not remain on the mesa region M. However, at least the metal film 64 positioned inside the outer peripheral trench 61 needs to contact the anode electrode 40 or needs to be electrically connected to the anode electrode 40 through the metal material embedded in the outer peripheral trench 61. With this configuration, at least the metal film 64 positioned inside the outer peripheral trench 61 has the same potential as the anode electrode 40.

Then, the cathode electrode 50 is formed on the back surface 22 of the semiconductor substrate 20, whereby the Schottky barrier diode 10 according to the present embodiment is completed.

As described above, according to the Schottky barrier diode 10 of the present embodiment, even if some misalignment should occur, a part of the upper surface 31 of the drift layer 30 outside the outer peripheral trench 61 is reliably covered with the first part 71 of the field insulating layer 70. In addition, the metal film 64 exists between the second part 72 of the field insulating layer 70 and the insulating film 63, and the metal film 64 has the same potential as the anode electrode 40, so that an electric field applied to the second part 72 of the field insulating layer 70 is significantly relaxed. This makes it possible to prevent dielectric breakdown caused due to misalignment between the outer peripheral trench 61 and the field insulating layer 70.

Figure 10:
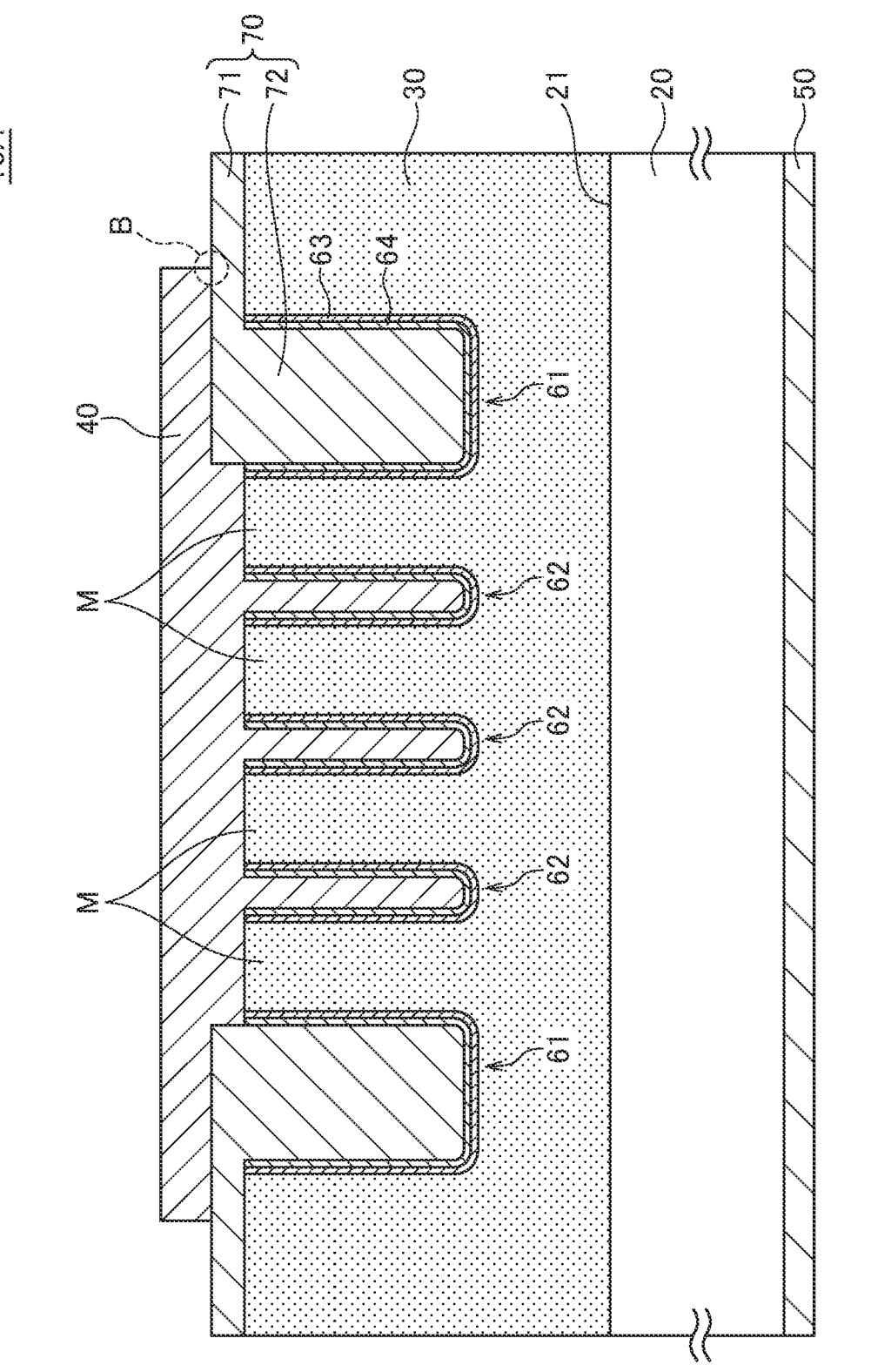
FIG. 10 is a schematic cross-sectional view for explaining the structure of a Schottky barrier diode 10A according to a modification.

FIG. 10 is a schematic cross-sectional view for explaining the structure of a Schottky barrier diode 10A according to a modification.

The Schottky barrier diode 10A illustrated in FIG. 10 differs from the above-described Schottky barrier diode 10 in that the outer peripheral trench 61 is filled with the field insulating layer 70. As exemplified by the Schottky barrier diode 10A illustrated in FIG. 10, the outer peripheral trench 61 may be filled with the field insulating layer 70 as long as the metal film 64 has the same potential as the anode electrode 40.

While the preferred embodiments of the present invention have been described, the present invention is not limited to the above embodiments, and various modifications may be made within the scope of the present invention, and all such modifications are included in the present invention.

EXAMPLES

Example 1

A simulation model of Example 1 having the same configuration as that of the Schottky barrier diode 10 illustrated in FIGS. 1 and 2 was assumed, and electric field strength was simulated with an 800 V reverse voltage applied between the anode electrode 40 and the cathode electrode 50. The dopant concentration of the semiconductor substrate 20 was set to $1 \times 10^{18}$ cm$^{-3}$, and the dopant concentration of the drift layer 30 was to $1 \times 10^{16}$ cm$^{-3}$. The thickness of the drift layer 30 was set to 7 μm. The width W1 of the outer peripheral trench 61 was set to 10 μm, the width of the center trench 62 was to 2 μm, and the depths of the trenches 61 and 62 were to 3 μm. Further, the width of a part of the drift layer 30 that contacts the anode electrode 40, i.e., the width of the mesa region M was set to 2 μm. The insulating film 63 was an HfO$_2$ film having a thickness of 50 nm, and the metal film 64 was a Cr film having a thickness of 100 nm. The field insulating layer 70 was an SiO$_2$ film having a thickness of 320 nm, and the field plate length was set to 10 μm.

As a result of the simulation, the strength of an electric field at the area A illustrated in FIG. 2, i.e., at a corner portion of the second part 72 of the field insulating layer 70 as the boundary between a part of the field insulating layer 70 that covers the side wall of the outer peripheral trench 61 and a part thereof covering the bottom portion of the outer peripheral trench 61 was 1.2 MV/cm. Further, the strength of an electric field at the area B illustrated in FIG. 2, i.e., at a part of the first part 71 of the field insulating layer 70 that contacts the outer peripheral end of the anode electrode 40 was 9.8 MV/cm. Thus, the electric field strength values of both the areas A and B were less than 10 MV/cm which is the dielectric breakdown electric field strength of SiO$_2$ constituting the field insulating layer 70.

Example 2

A simulation model of Example 2 having the same configuration as that of the Schottky barrier diode 10A illustrated in FIG. 10 was assumed, and electric field strength was simulated with an 800 V reverse voltage applied between the anode electrode 40 and the cathode electrode 50. The simulation model of Example 2 was different from the simulation model of Example 1 in that the outer peripheral trench 61 was filled with the field insulating layer 70. The parameters in the simulation model of Example 2 were the same as those in the simulation model of Example 1. As a result of the simulation, the maximum strength of an electric field applied to the second part 72 of the field insulating layer 70 was 1.2 MV/cm, and the strength of an electric field at the area B illustrated in FIG. 10 was 9.8 MV/cm.

Example 3

A simulation model of Example 3 different from the simulation model of Example 1 in that Al$_2$O$_3$ and SiO$_2$ were used as the materials of the first part 71 of the field insulating layer 70 and the second part 72 thereof, respectively, was assumed, and electric field strength was simulated with an 800 V reverse voltage applied between the anode electrode 40 and the cathode electrode 50. The parameters in the simulation model of Example 3 were the same as those in the simulation model of Example 1. As a result of the simulation, the strength of an electric field at the area A was 0.4 MV/cm, and the strength of an electric field at the area B was 6.7 MV/cm.

COMPARATIVE EXAMPLE

Figure 11:
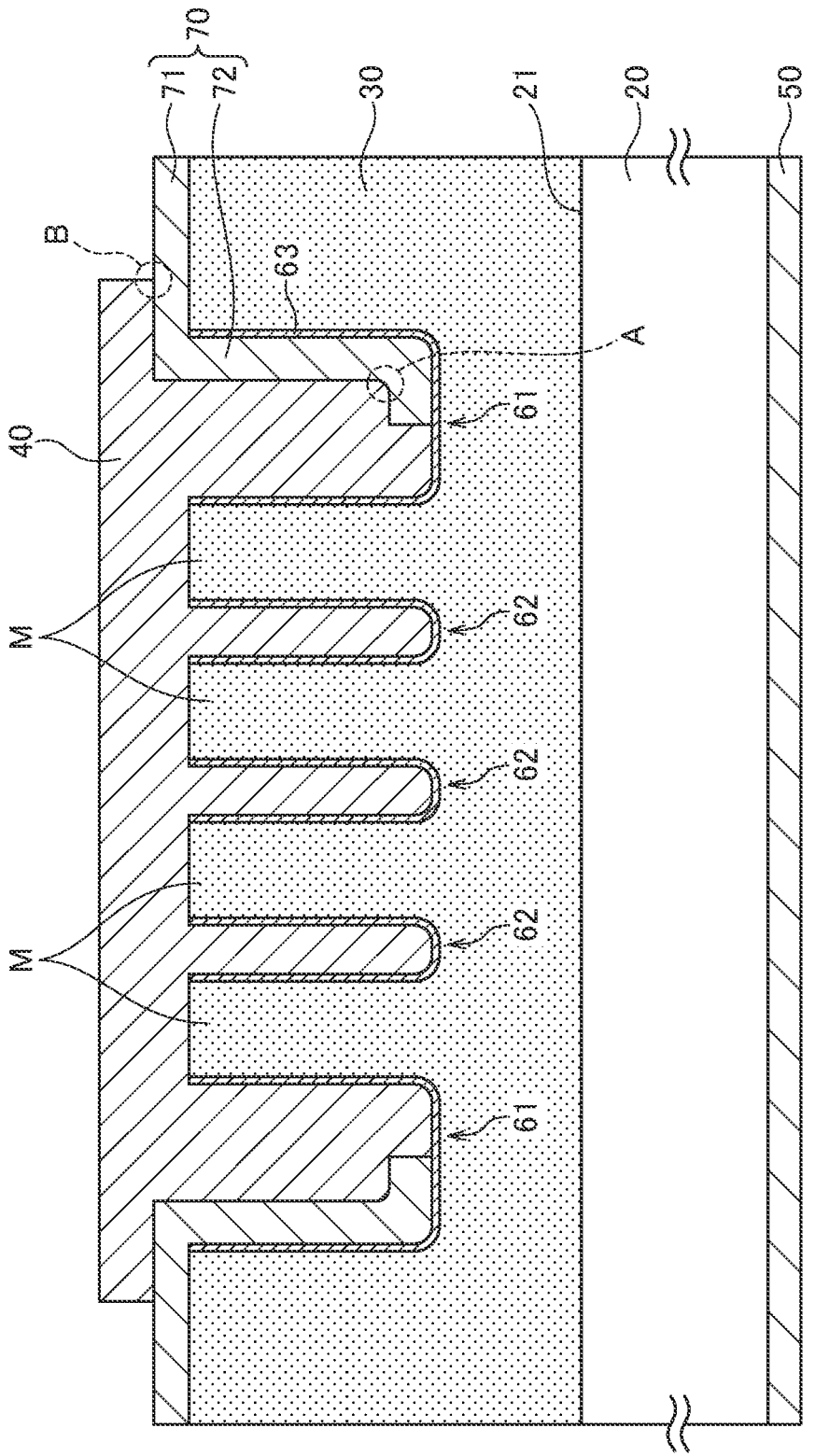
FIG. 11 is a schematic cross-sectional view for explaining the structure of a Schottky barrier diode according to a comparative example.

A simulation model of a comparative example illustrated in FIG. 11 was assumed, and electric field strength was simulated with an 800 V reverse voltage applied between the anode electrode 40 and the cathode electrode 50. The simulation model of the comparative example was different from the simulation model of Example 1 in that the metal film 64 was omitted. The parameters in the simulation model of the comparative example were the same as those in the simulation model of Example 1. As a result of the simulation, the maximum strength of an electric field applied to the area A illustrated in FIG. 11 was 11.2 MV/cm, and the strength of an electric field at the area B illustrated in FIG. 11 was 10.2 MV/cm. Thus, the electric field strength values of both the areas A and B exceeded 10 MV/cm which is the dielectric breakdown electric field strength of $SiO_2$.

REFERENCE SIGNS LIST

10, 10A Schottky barrier diode
20 semiconductor substrate
21 upper surface of semiconductor substrate
22 back surface of semiconductor substrate
30 drift layer
31 upper surface of the drift layer
40 anode electrode
50 cathode electrode
61 outer peripheral trench
62 center trench
63 insulating film
70 field insulating layer
71 first part of field insulating layer
72 second part of field insulating layer
E0-E3 edge
M mesa region
R resist

What is claimed is:

1. A Schottky barrier diode comprising:
a semiconductor substrate made of gallium oxide;
a drift layer made of gallium oxide and formed on the semiconductor substrate;
an anode electrode brought into Schottky contact with the drift layer;
a cathode electrode brought into ohmic contact with the semiconductor substrate;
a ring-shaped outer peripheral trench formed in the drift layer, wherein the ring-shaped outer peripheral trench comprises a bottom portion, a first inner wall extending from the bottom portion, and a second inner wall extending from the bottom portion, wherein the first inner wall defines an inner periphery of the ring-shaped outer peripheral trench, wherein the second inner wall defines an outer periphery of the ring-shaped outer peripheral trench, and wherein a part of the anode electrode is in the ring-shaped outer peripheral trench;

a center trench formed in the drift layer and surrounded by the ring-shaped outer peripheral trench, with a mesa region of the drift layer interposed between the first inner wall of the ring-shaped outer peripheral trench and a lateral wall of the center trench, such that the center trench is disposed closer to the first inner wall than the second inner wall of the ring-shaped outer peripheral trench;
an insulating film covering the bottom portion, the first inner wall, and the second inner wall of the ring-shaped outer peripheral trench formed in the drift layer;
a metal film covering the bottom portion, the first inner wall, and the second inner wall of the ring-shaped outer peripheral trench with the insulating film interposed between i) the metal film and ii) the bottom portion, the first inner wall, and the second inner wall of the ring-shaped outer peripheral trench; and
a field insulating layer including:
a first part positioned between an upper surface of the drift layer and the anode electrode and formed in a first ring shape to surround the ring-shaped outer peripheral trench in a plan view; and
a second part formed in a second ring shape and covering at least a part of the second inner wall of the ring-shaped outer peripheral trench and a part of the bottom portion of the ring-shaped outer peripheral trench with the metal film and the insulating layer interposed between i) the second part and ii) at least the part of the second inner wall and the part of the bottom portion of the ring-shaped outer peripheral trench, and without the second part covering any part of the first inner wall of the ring-shaped outer peripheral trench,
wherein the bottom portion of the ring-shaped outer peripheral trench includes another part not covered by the second part of the field insulating layer,
wherein the another part of the bottom portion is different from the part of the bottom portion and is disposed closer to the first wall and the center trench than the part of the bottom portion, and
wherein the metal film formed in the ring shape and covering the bottom portion is exposed to the anode electrode via the another part of the bottom portion such that the metal film is in contact with and electrically connected to the anode electrode through the another part of the bottom portion.

2. The Schottky barrier diode as claimed in claim 1, wherein the first and second parts are formed of different insulating materials.

* * * * *